United States Patent
Falk et al.

(10) Patent No.: US 10,741,707 B2
(45) Date of Patent: Aug. 11, 2020

(54) GRAPHENE-CONTACTED NANOTUBE PHOTODETECTOR

(71) Applicant: INTERNATIONAL BUSINESS MACHINES CORPORATION, Armonk, NY (US)

(72) Inventors: Abram L. Falk, Port Chester, NY (US); Kuan-Chang Chiu, Nantou County (TW); Damon B. Farmer, White Plains, NY (US); Shu-Jen Han, Cortlandt Manor, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 196 days.

(21) Appl. No.: 15/933,681

(22) Filed: Mar. 23, 2018

(65) Prior Publication Data
US 2019/0296158 A1 Sep. 26, 2019

(51) Int. Cl.
*H01L 31/028* (2006.01)
*H01L 31/18* (2006.01)
*H01L 29/16* (2006.01)

(52) U.S. Cl.
CPC ........ *H01L 31/028* (2013.01); *H01L 29/1606* (2013.01); *H01L 31/1804* (2013.01)

(58) Field of Classification Search
None
See application file for complete search history.

(56) References Cited

U.S. PATENT DOCUMENTS

| 7,449,133 | B2 | 11/2008 | Gruner et al. |
| 8,053,782 | B2 | 11/2011 | Avouris et al. |
| 8,598,568 | B2 | 12/2013 | Kim et al. |
| 2006/0038299 | A1* | 2/2006 | Hirakata ................ B82Y 10/00 257/773 |
| 2011/0041980 | A1 | 2/2011 | Kim et al. |
| 2011/0042650 | A1 | 2/2011 | Avouris et al. |
| 2011/0220191 | A1 | 9/2011 | Flood |
| 2012/0161106 | A1 | 6/2012 | Kim et al. |
| 2013/0107344 | A1* | 5/2013 | Avouris ............. H01L 31/0352 359/245 |
| 2013/0126700 | A1 | 5/2013 | Choi et al. |
| 2014/0042390 | A1 | 2/2014 | Gruner et al. |
| 2014/0235123 | A1 | 8/2014 | Lin et al. |
| 2016/0020280 | A1* | 1/2016 | Heo ..................... H01L 31/028 257/27 |
| 2017/0084761 | A1* | 3/2017 | Cho .................. H01L 31/02322 |

FOREIGN PATENT DOCUMENTS

| CN | 104766902 | 7/2015 |
| CN | 106024968 | 10/2016 |

OTHER PUBLICATIONS

Kuan-Chang Chiu et al., Strong and Broadly Tunable Plasmon Resonances in Thick Films of Aligned Carbon Nanotubes, ACS Publications, American Chemical Society, Aug. 2017.

* cited by examiner

*Primary Examiner* — Walter H Swanson
*Assistant Examiner* — Kien C Ly
(74) *Attorney, Agent, or Firm* — Tutunjian & Bitetto, P.C.; Vazken Alexanian

(57) ABSTRACT

Photodetectors and methods of forming the same include a first electrode. A carbon nanotube film is formed on the first electrode. A first graphene sheet is formed on the carbon nanotube film. A second graphene sheet is configured to exert an electrical field on the first graphene sheet that changes an electrical property of the first graphene sheet.

15 Claims, 7 Drawing Sheets

GRAPHENE-CONTACTED NANOTUBE PHOTODETECTOR

BACKGROUND

Technical Field

The present invention generally relates to photodetectors and, more particularly, to the fabrication of graphene-contacted nanotube photodetectors.

Description of the Related Art

While graphene has been used in photodetectors, the material does not absorb a high percentage of light because it is only a monolayer. Thus, graphene photodetectors typically have a low extrinsic quantum efficiency, despite their high intrinsic quantum efficiency.

SUMMARY

A photodetector includes a first electrode. A carbon nanotube film is formed on the first electrode. A first graphene sheet is formed on the carbon nanotube film. A second graphene sheet is configured to exert an electrical field on the first graphene sheet that changes an electrical property of the first graphene sheet.

A method of forming a photodetector includes positioning a carbon nanotube film on a first electrode. A first graphene sheet is positioned on the carbon nanotube film. A second graphene sheet is positioned on the first graphene sheet that exerts an electrical field on the first graphene sheet that changes an electrical property of the first graphene sheet.

A method of forming a photodetector includes positioning a first graphene sheet on a transparent substrate. A first insulator layer is formed on the first graphene sheet. A second graphene sheet is positioned on the first insulator layer. A carbon nanotube film is positioned on the second graphene sheet. A third graphene sheet is positioned on the carbon nanotube film. A second insulator layer is positioned on the third graphene sheet. A fourth graphene sheet is positioned on the second insulator layer.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention combine graphene and carbon nanotubes in a photodetector. Carbon nanotubes can absorb and detect light having frequencies below the bandgap of conventional semiconductor materials, such as silicon, including the terahertz range, the far-infrared range, the mid-infrared range, and at least part of the near-infrared range. The absorption of carbon nanotubes is strong in wavelengths ranging from terahertz frequencies through the visible range. Graphene can form a high-quality contact to carbon nanotubes and is nearly transparent over an extremely broad wavelength range. Graphene-contacted carbon nanotube photodetectors are therefore used herein for broadband photodetection.

The present embodiments therefore use a relatively thick film of carbon nanotubes to increase absorption, while using the electrical properties of graphene to tune and optimize the performance of the photodetector by adjusting the Fermi level of the graphene contact. The present embodiments thus take advantage of plasmonic photon absorption by the carbon nanotubes and use one or more layers of graphene as an electrode.

Figure 1:
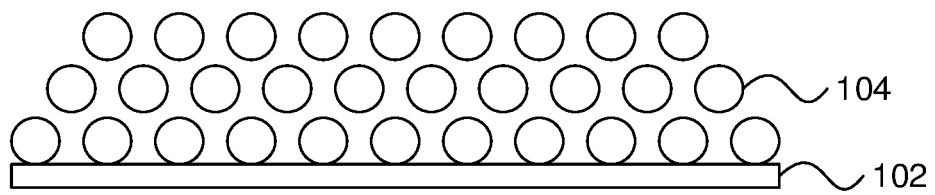
FIG. 1 is a cross-sectional diagram of a step in the formation of a carbon nanotube photodetector where a carbon nanotube film is formed in accordance with an embodiment of the present invention.

Referring now to FIG. 1, a cross-sectional view of a step in the fabrication of a photodetector that incorporates both carbon nanotubes and graphene is shown. A membrane 102 is used as a substrate for the formation of self-assembled, aligned carbon nanotubes 104. It is specifically contemplated that the membrane 102 may be formed from any appropriate material including, e.g., a polycarbonate material. The carbon nanotubes 104 are aligned in parallel and stacked to a predetermined thickness. The carbon nanotubes 104 are depicted with spacing between them for the ease of understanding, but it should be understood that the carbon nanotubes 104 may be tightly packed.

In one embodiment, the aligned, stacked carbon nanotubes 104 may be formed with a length that corresponds to the frequency range to be detected. When radiation is incident on the carbon nanotubes 104, the radiation induces a plasmon oscillation along the length of the carbon nanotubes, which heats the nanotube layer. Plasmons are light fields coupled to oscillating electrical charges on a surface. In confined systems, a plasmon's energy is quantized in a manner analogous to the description of quantized light in photons or quantized mechanical oscillations in phonons. Each nanotube therefore has a characteristic plasmon resonance frequency that is determined by its length, and this determines an associated electromagnetic frequency that couples to the plasmons at that characteristic frequency.

The absorption of light in the carbon nanotubes 104 heats the layer, causing a photothermoelectric voltage that can be detected. The magnitude of this current depends on the Fermi energy of the carbon nanotubes, which represents the amount of energy needed to free an electron from the material. The use of only semiconducting carbon nanotubes (as opposed to including metallic carbon nanotubes) increases the photothermoelectric voltage. The magnitude of the photothermoelectric signal also depends on the work functions of the two metals. Therefore, adjusting the work function of the contacts is important to achieving the maximum signal from the device.

In addition to the photothermoelectric effect, photovoltaic effects can also allow the device to transduce an optical signal into an electrical signal. Here, light having a wavelength below the bandgap of the carbon nanotubes (approximately 1300 nm) can create excitons in the carbon nanotubes, which can be separated by internal electric fields and transported into contacts. As with the photothermoelectric effect, optimizing the Fermi level of the carbon nanotubes and the work function of the contacts is important to achieving a maximum photovoltaic signal from the device.

Thus, although any appropriate process for forming the carbon nanotubes 104 in the aligned, stacked layer can be used, it is specifically contemplated that semiconducting carbon nanotubes may be purified in solution and subsequently deposited in alignment on the membrane 102. When carbon nanotubes are grown, they generally are formed in a proportion of roughly ⅓ metallic and ⅔ semiconductor structures, with the electrical characteristics of the nanotube depending on how a graphene sheet might be "rolled up" to represent the nanotube. In particular, nanotubes are described by a pair of indices, (m, n), with each index representing vectors along a graphene lattice. If n−m is divisible by 3, the resulting nanotube is metallic, whereas other nanotubes are semiconducting.

Purification can be accomplished by separating the nanotubes in solution into a semiconducting solution and a metallic solution. In particular, the nanotubes may be placed into a solution of toluene and poly[(9,9-dioctylfluorenyl-2,7-diyl)-alt-co-(6,6'-{2,2'-bipyridine})] (known as PFO-BPy). The solution is heated in block 204 to about 80° C. for several minutes, causing the PFO-BPy to wrap around carbon nanotubes and disperse them into the toluene. The PFO-BPy exclusively selects semiconducting nanotubes, such that only the semiconducting nanotubes are dispersed.

A centrifuge may then be used to separate the semiconducting nanotubes from the metallic nanotubes in the solution.

After the semiconducting nanotubes have been purified, they are dispersed in water with a surfactant (e.g., sodium dodecylbenzenesulfonate). This surfactant provides a negative charge to the surface of the nanotubes. A weak vacuum then slowly pulls the suspension through a polycarbonate membrane, causing the nanotubes to self-organize and align in the plane of the membrane. This results in thick films of aligned carbon nanotubes, with the thickness ranging from 30 nm to 500 nm. The membrane is then dried and the membrane is placed on the target substrate with the nanotube film face-down. The nanotube film is pressed against the substrate so that it adheres, and the membrane is dissolved with chloroform.

The deposited nanotubes can then be cut to a uniform length to sharpen the absorption spectrum of the carbon nanotubes 104. This may be accomplished using, e.g., reactive ion etching in oxygen and photolithographic or electron beam lithographic processes. If an electron beam lithographic process is used, the nanotube film is coated with, e.g., poly-methyl-methacrylate (PMMA), with stripes where the nanotube is to be etched being exposed by a scanning electron microscope. Development in a solution of isopropyl alcohol and water selectively dissolves the exposed polymer, exposing the surface of the nanotubes underneath. If photolithography is used instead, ultraviolet exposure substitutes for the electron beam exposure and a different polymer is used to define the regions of nanotubes to be cut. A reactive ion etch in oxygen then etches away the exposed nanotube regions, after which the polymer is washed away by a solvent. By etching many stripes of nanotubes, the length of the nanotubes can be precisely set to anywhere in an exemplary range of about 5 nm to about 5 μm.

Following this process, a layer of parallel carbon nanotubes 104 at uniform length may be formed with arbitrary thickness.

Figure 2:
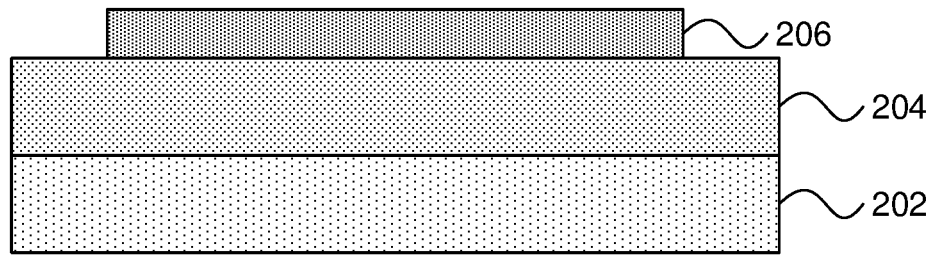
FIG. 2 is a cross-sectional diagram of a step in the formation of a carbon nanotube photodetector where an electrode is formed on a substrate in accordance with an embodiment of the present invention.

Referring now to FIG. 2, a cross-sectional view of a step in the fabrication of a photodetector that incorporates both carbon nanotubes and graphene is shown. An insulating film 204 is deposited on a substrate 202. A conductive electrode 206 is then formed on top of the insulating film 204.

It is specifically contemplated that the insulating film 204 may be formed silicon dioxide, but it should be understood that any appropriate insulator material may be used instead. It is specifically contemplated that palladium may be used for the conductive contact 206, as it binds readily to carbon nanotubes. The semiconductor substrate 202 may be a bulk-semiconductor substrate. In one example, the bulk-semiconductor substrate may be a silicon-containing material. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multi-layers thereof. Although silicon is the predominantly used semiconductor material in wafer fabrication, alternative semiconductor materials can be employed, such as, but not limited to, germanium, gallium arsenide, gallium nitride, cadmium telluride, and zinc selenide. Although not depicted in the present figures, the semiconductor substrate 202 may also be a semiconductor on insulator (SOI) substrate.

The insulating film 204 and the conductive electrode 206 may be deposited using any appropriate deposition process, including, e.g., chemical vapor deposition (CVD), physical vapor deposition (PVD), atomic layer deposition (ALD), or gas cluster ion beam (GCIB) deposition. CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GCIB deposition, a high-pressure gas is allowed to expand in a vacuum, subsequently condensing into clusters. The clusters can be ionized and directed onto a surface, providing a highly anisotropic deposition.

Figure 3:
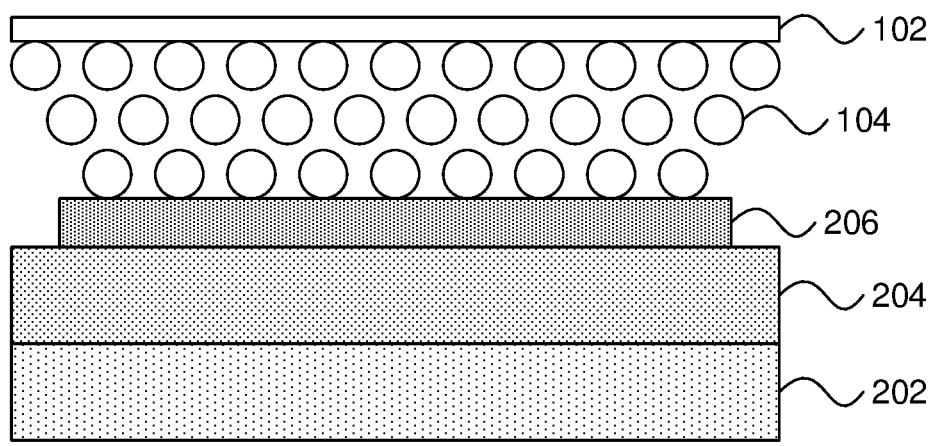
FIG. 3 is a cross-sectional diagram of a step in the formation of a carbon nanotube photodetector where the carbon nanotube film is transferred to the electrode in accordance with an embodiment of the present invention.

Referring now to FIG. 3, a cross-sectional view of a step in the fabrication of a photodetector that incorporates both carbon nanotubes and graphene is shown. The carbon nanotubes 104 are transferred to the conductive electrode 206. This may be accomplished by wetting the electrode 206 with water and placing the carbon nanotubes 104 on the electrode using the membrane 102. Mechanical pressure is applied to the top of the membrane 102 and the water is allowed to dry, causing the carbon nanotubes 104 to stick to the electrode 206.

Figure 4:
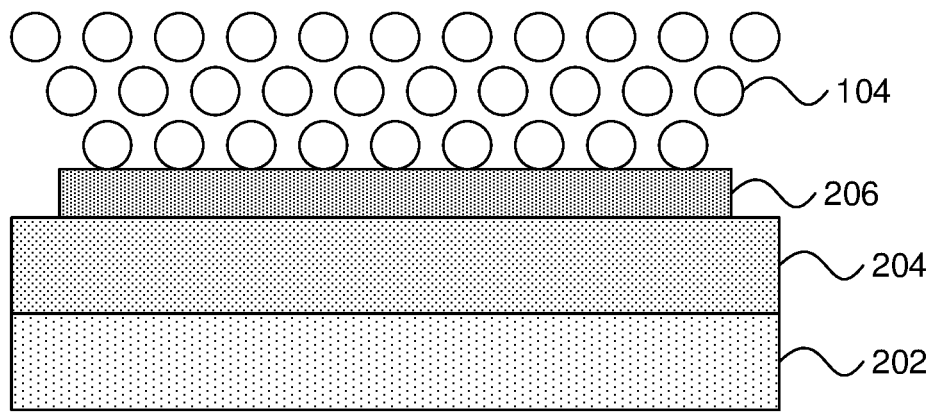
FIG. 4 is a cross-sectional diagram of a step in the formation of a carbon nanotube photodetector where a transferring membrane is removed in accordance with an embodiment of the present invention.

Referring now to FIG. 4, a cross-sectional view of a step in the fabrication of a photodetector that incorporates both carbon nanotubes and graphene is shown. The membrane 102 is dissolved to expose the carbon nanotubes 104. In embodiments using a polycarbonate membrane 102, this may be accomplished using chloroform, but it should be understood that any appropriate wet or dry chemical etch may be used.

Figure 5:
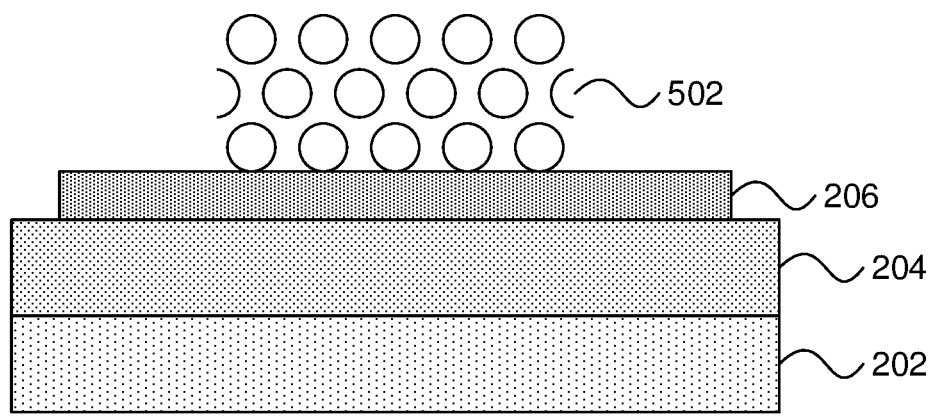
FIG. 5 is a cross-sectional diagram of a step in the formation of a carbon nanotube photodetector where the carbon nanotube film is etched to size in accordance with an embodiment of the present invention.

Referring now to FIG. 5, a cross-sectional view of a step in the fabrication of a photodetector that incorporates both carbon nanotubes and graphene is shown. The film of carbon nanotubes 104 is then patterned to form etched film 502. This may be accomplished by any appropriate process, but it is specifically contemplated that an etch mask is formed on top of the nanotubes and an RIE is performed to etch away exposed nanotubes. It is specifically contemplated that the mask may be a bilayer electron-beam resist that includes a PMMA layer and a hydrogen silsequioxane layer. The resist may subsequently be removed by any appropriate wet or dry chemical etch such as, e.g., chloroform.

Figure 6:
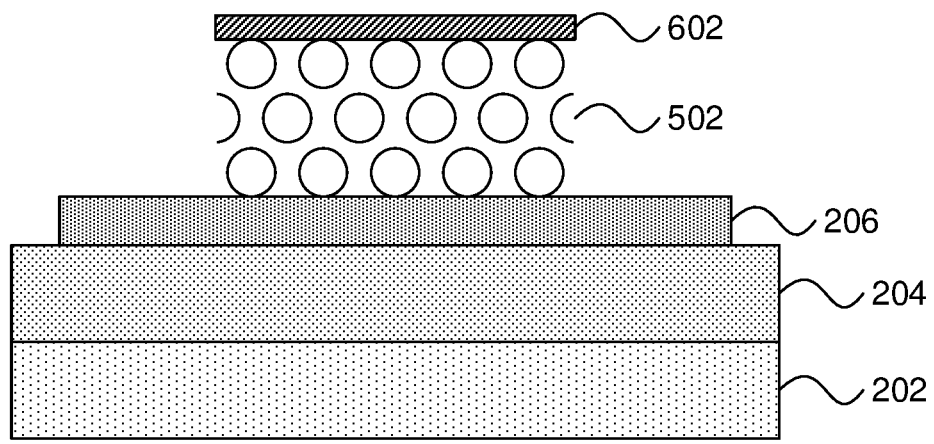
FIG. 6 is a cross-sectional diagram of a step in the formation of a carbon nanotube photodetector where a graphene film is transferred to the carbon nanotube film in accordance with an embodiment of the present invention.

Referring now to FIG. 6, a cross-sectional view of a step in the fabrication of a photodetector that incorporates both carbon nanotubes and graphene is shown. A first graphene film 602 is formed and then transferred to the top of the etched nanotube film 502. The graphene film 602 may be formed by any appropriate process, but it is specifically contemplated that the graphene film 602 may be grown on a copper foil that is dissolved in acid to release the graphene film 602. The graphene film 602 is washed with water and then transferred to the top of the etched nanotube film 502. The graphene film 602 may then be gently dried with an air gun.

Figure 7:
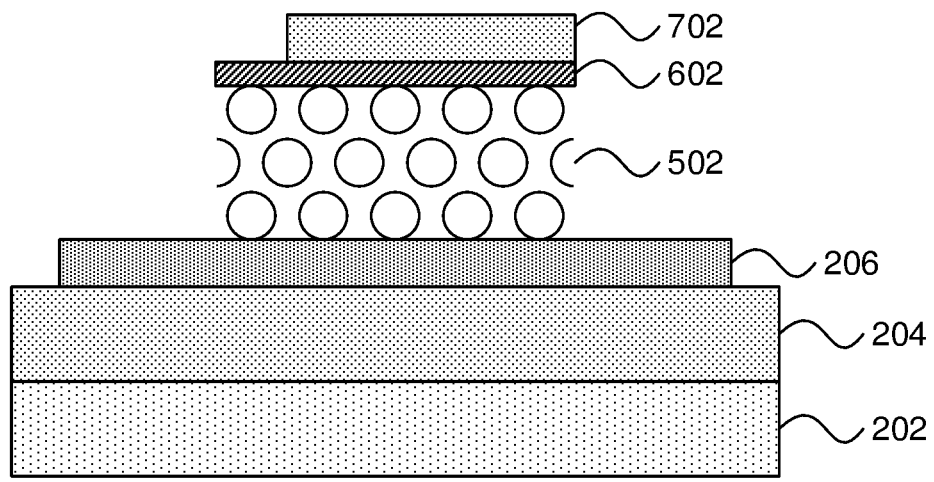
FIG. 7 is a cross-sectional diagram of a step in the formation of a carbon nanotube photodetector where an insulator layer is formed on the carbon nanotube film in accordance with an embodiment of the present invention.

Referring now to FIG. 7, a cross-sectional view of a step in the fabrication of a photodetector that incorporates both carbon nanotubes and graphene is shown. A layer of dielectric material 702 is formed from, e.g., silicon dioxide. The dielectric layer 702 may be formed by any appropriate process including, e.g., CVD, ALD, PVD, or GCIB deposition and may be formed in place on the graphene film 602 or may be formed separately and then transferred into position.

Figure 8:
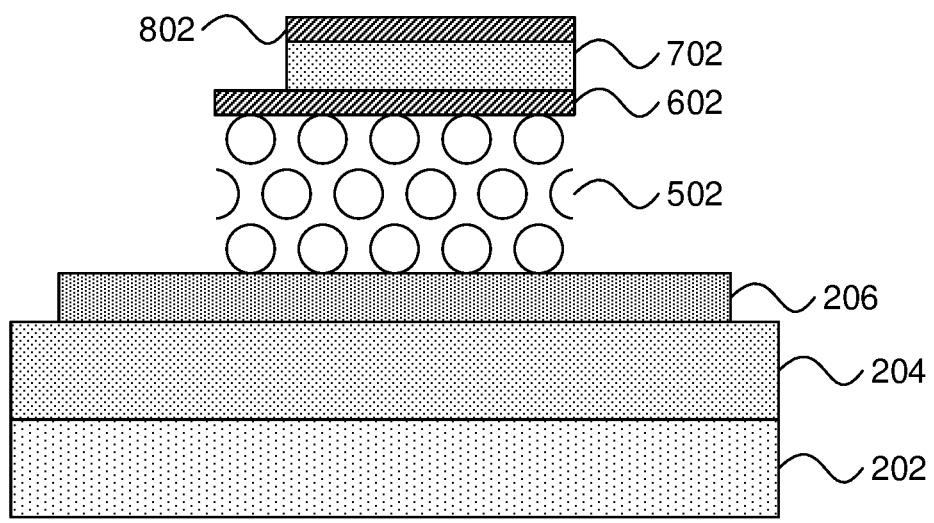
FIG. 8 is a cross-sectional diagram of a step in the formation of a carbon nanotube photodetector where a graphene gate is transferred to the insulator layer in accordance with an embodiment of the present invention.

Referring now to FIG. 8, a cross-sectional view of a step in the fabrication of a photodetector that incorporates both carbon nanotubes and graphene is shown. A second graphene film 802 is formed and transferred to the dielectric layer 702. The second graphene film 802 may be formed by any appropriate process and may be transferred by any appropriate process. Whereas the first graphene film 602 functions as an electrode, forming a circuit with electrode 206 across the nanotube film 502, the second graphene film 802 functions as a gate, with dielectric layer 702 functioning as a gate dielectric.

Figure 9:
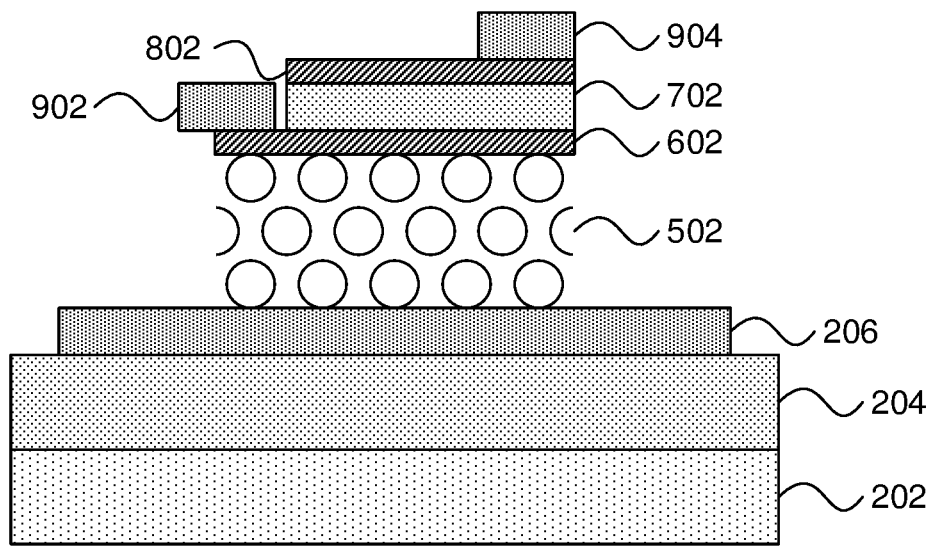
FIG. 9 is a cross-sectional diagram of a step in the formation of a carbon nanotube photodetector where electrodes are formed on the graphene films in accordance with an embodiment of the present invention.

Referring now to FIG. 9, a cross-sectional view of a step in the fabrication of a photodetector that incorporates both carbon nanotubes and graphene is shown. A second conductive electrode 902 is formed in contact with the first graphene film 602 and a third conductive electrode 904 is formed in contact with the second graphene film 802. It is specifically contemplated that the second and third conductive electrodes may be formed from palladium, but it should be understood that any appropriate conductive material may be used instead. The conductive electrodes 902 and 904 may be formed by any appropriate process including, e.g., photolithography or electron beam lithography. In some embodiments a polymer mask is formed, followed by thermal or electron-beam evaporation of a metal into the patterned regions. The polymer mask may then be removed using a solvent such as, e.g., acetone.

The first conductive electrode 206 and the second conductive electrode 902 form a circuit, with current passing between them being generated by light that is incident on the nanotube film 502 via the photovoltaic and/or photothermoelectric effects. The third conductive electrode 904 is used to create a voltage difference between the third conductive electrode 904 and the first conductive electrode 902. This voltage $V_g$ is applied to the second graphene film 802 to adjust the Fermi level of the first graphene film 602. The adjustment of $V_g$ thereby adjusts the sensitivity of the device, in particular optimizing the photothermoelectric current. The second graphene film 802 thereby acts as a gate, with the applied voltage (and hence, the resulting electrical field) affecting the electrical properties of the rest of the device. Graphene is used in the present embodiments for the gate structure because it is largely transparent to incoming light due to its extreme thinness, but it should be understood that any appropriately conductive gate material may be used if it is suitably transparent to the wavelengths of light in question.

Figure 12:
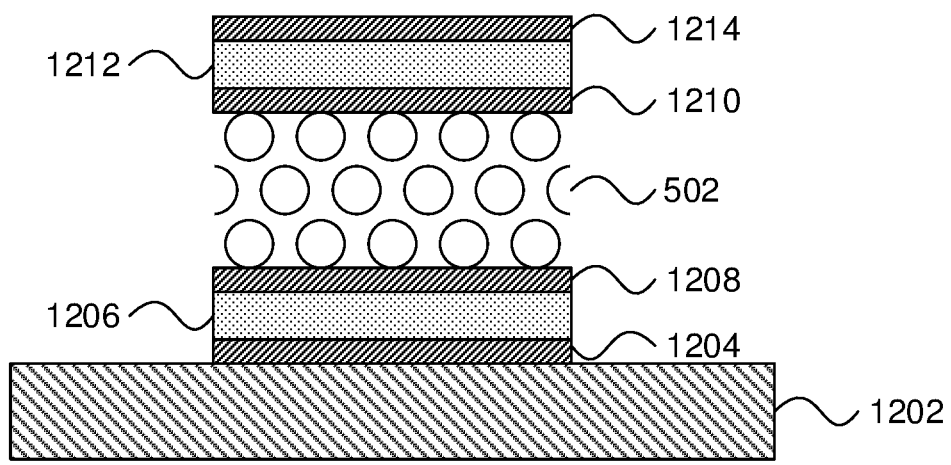
FIG. 12 is a cross-sectional diagram of an alternative embodiment of a carbon nanotube photodetector that is sensitive to light from two different directions in accordance with an embodiment of the present invention.

Referring now to FIG. 12, an alternative embodiment of a photodetector is shown. This embodiment may be fabricated using the same processes described above. The conductive contacts are omitted for clarity. This embodiment represents a bidirectional photodetector, where the sensitivity can be tuned to receive incident light from above or below. To that end, a transparent substrate 1202 is used. The transparent substrate 1202 formed from any appropriate rigid material that transmits light at the wavelengths in question. Suitable transparent substrate materials include glass for visible wavelength photodetectors and zinc selenide or high-resistivity silicon for infrared photodetectors.

A first gate 1204 is placed on the transparent substrate 1202. The first gate 1204 is formed from a graphene film and may be formed and transferred to the transparent substrate 1202 in the manner described above. A first insulator 1206 is formed from a material that is transparent at the wavelengths in question such as, e.g., silicon dioxide. A first contact 1208 is then formed from a graphene film and transferred to the first insulator 1206.

At this point, a nanotube film 502 is positioned on the first contact 1208. The nanotube film 508 can be formed according to the process set forth above or any other suitable process. A second contact 1210 is formed from a graphene film and transferred to the top of the nanotube film 502. A second insulator 1212 is formed on the second contact and a second gate 1214 is formed from a graphene film and transferred to the top of the second insulator 1212. The second insulator 1212 may be formed from the same insulator material as the first insulator 1212 or may be formed from a different material.

As noted above, the conductive contacts are omitted from FIG. 12 for simplicity, but it should be understood that the first gate 1204, the first contact 1208, the second contact 1210, and the second gate 1214 each have respective conductive contacts that provide electrical contact to the respective graphene films. The first contact 1208 and the second contact 1210 form an electrical circuit across the carbon nanotube film 504 to register photothermoelectric currents. The first gate 1204 and the second gate 1214 receive a voltage that affects the Fermi energy of the respective first contact 1208 and second contact 1210. In this manner, both the top contact 1210 and the bottom contact 1208 can be tuned to optimize the performance of the photodetector. For example, a large negative voltage can be applied to the top gate 1214 to make the top contact 1210 highly p-type, while a large positive voltage can be applied to the bottom gate 1204 to make the bottom contact 1208 accumulate electrons. This embodiment does not include bulk metal on the top or the bottom of the photodetector, allowing sensitivity to light from either the top or the bottom.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease f description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), the spatially relative descriptors used herein can be interpreted accordingly. In addition, it will also be understood that when a layer is referred to as being "between" layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Figure 10:
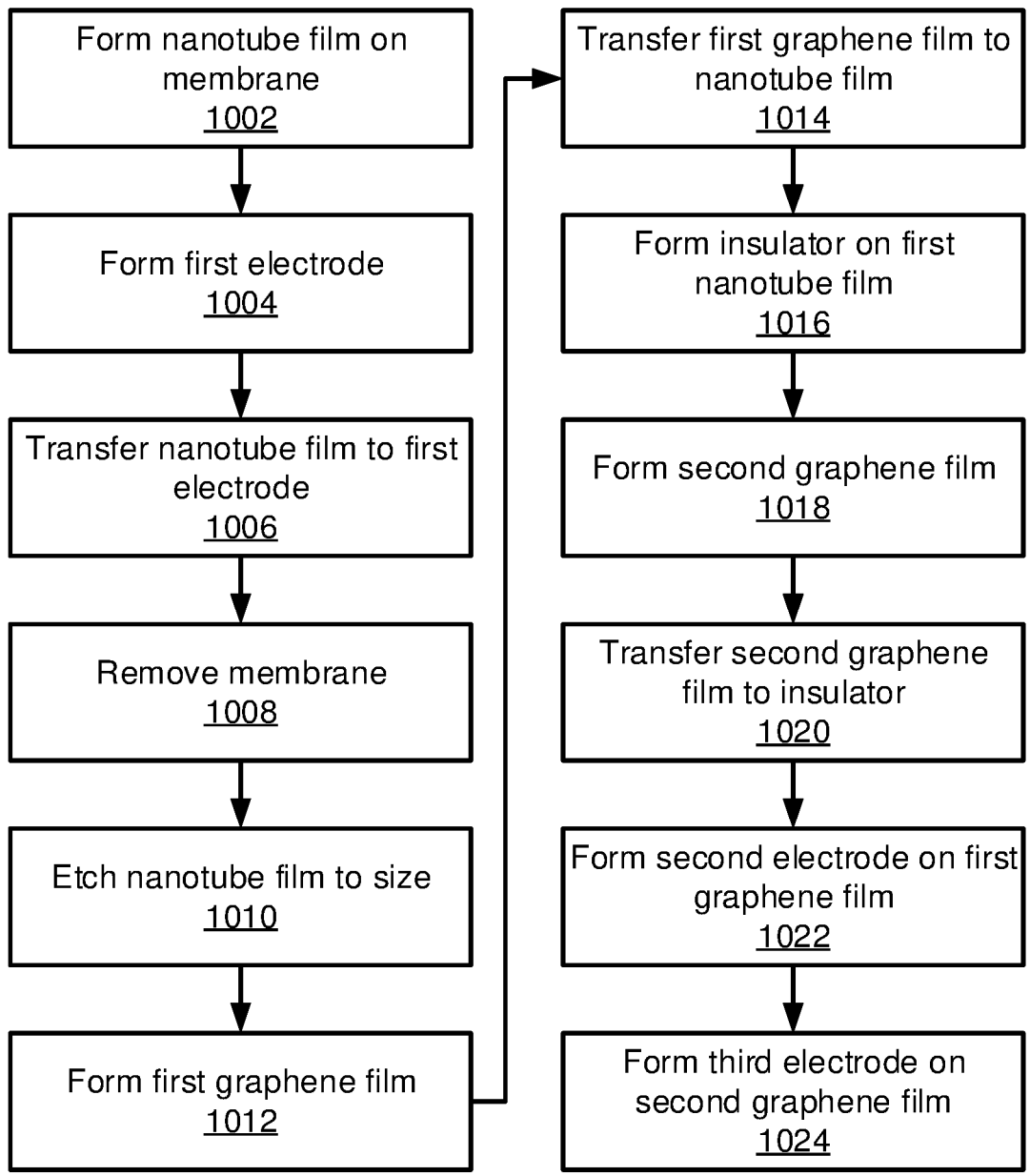
FIG. 10 is a block/flow diagram of a method of forming a carbon nanotube photodetector in accordance with an embodiment of the present invention.

Referring now to FIG. 10, a process for forming a photodetector device is shown. Block 1002 forms the carbon nanotubes 104 on membrane 102 by any appropriate fabrication process, for example by filtering the nanotubes in solution and depositing the nanotubes on a surface within a container having movable walls, such that by contracting the walls the nanotubes can be aligned in a film. Block 1002 may also trim the lengths of nanotubes 104 by an appropriate masking and etching process that tunes the nanotubes 104 to a particular resonant length.

Block 1004 separately forms first conductive electrode 206 on an insulator 204. The first conductive electrode 206 may be formed from, e.g., palladium or any other appropriate conductive material and may be patterned by photolithographic etching processes. Block 1006 then transfers the carbon nanotubes 104 to the first conductive electrode 206, wetting the nanotubes 104 and mechanically pressing the nanotubes 104 to the electrode 206 until the water dries. Block 1008 then removes the membrane, dissolving it away from the nanotubes 104 by an appropriate etch that leaves the nanotubes 104 undamaged.

Block 1010 etches the nanotubes 104 to a nanotube film 502 of a predetermined size, according to the size and sensitivity called for by device design. Block 1012 forms a first graphene film 602. The size of the first graphene film 602 may be determined as being the same size as the etched nanotube film 502 or may be any other appropriate size, larger or smaller. The first graphene film 602 may be fabricated by any known process, but it is specifically contemplated that graphene may be formed on a copper sheet that is subsequently dissolved in an acid etch. The graphene film may then be washed clean of acid and cut to size before being transferred to the etched nanotube film 502 in block 1014.

Block 1016 forms an insulator 702 on the first nanotube film 602. It should be understood that at least a portion of the top surface of the first nanotube film 602 should be left exposed to facilitate the formation of a conductive contact thereon. The insulator 702 may be any appropriate insulating material such as, e.g., silicon dioxide and may be formed by any appropriate process.

Block 1018 forms a second graphene film 802 and block 1020 transfers the second graphene film 802 to the insulator layer 702. The second graphene film 802 may be any appropriate size, but it should be as large or smaller than the insulator layer 702, to prevent unintended electrical contact between the second graphene film 802 and the first graphene film 602.

Block 1022 forms a second conductive electrode 902 on the first graphene film 602 and block 1024 forms a third conductive electrode 904 on the second graphene film 802. The first conductive electrode 206 and the second conductive electrode 902 are thereby in electrical communication with one another through the nanotube film 502 and the first graphene film 602, while the third conductive contact 904 is insulated from both by the insulator layer 702.

Figure 11:
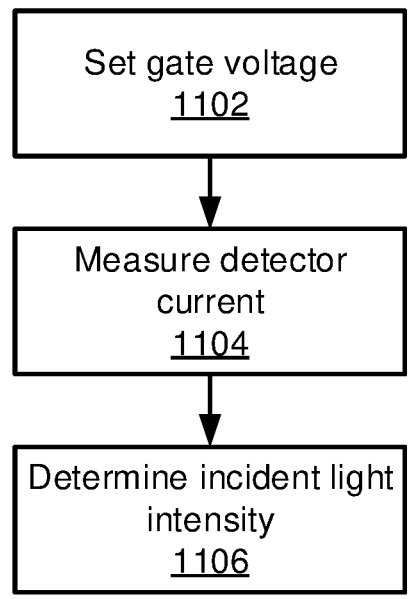
FIG. 11 is a block/flow diagram of a method of determining light intensity using a carbon nanotube photodetector in accordance with an embodiment of the present invention.

Referring now to FIG. 11, a process for measuring light intensity using the above-described embodiments is shown. Block 1102 sets an appropriate gate voltage $V_g$ on the third conductive electrode 904 and, thereby, on the second graphene film 802. The field generated by gate affects the Fermi energy of the first graphene film 602, which dictates how much energy is needed to free electrons in a material. The optimal gate voltage $V_g$ is the one that maximizes the photodetection signal. In some embodiments, the work function of the graphene film 602 is set to be as different as possible from the work function of the bottom contact 206 to the nanotubes. Thus, if the bottom contact 206 is a high-work-function metal, such as palladium, a highly positive gate voltage to the graphene should be applied, so that the graphene film 602 accumulates electrons. If the bottom contact 602 is a low-work-function metal, such as aluminum, a highly negative gate voltage should be applied to the graphene, so that the graphene film 602 accumulates holes.

As light reaches the carbon nanotube film 502 (and, to a lesser degree, the first graphene film 602) and is absorbed, photothermoelectric and photovoltaic effects cause the release of such electrons, creating a current between the first conductive electrode 206 and the second conductive electrode 902. This current is measured in block 1104 and depends on the intensity of incident light. Thus the intensity of the incident light is determined in block 1106. In some embodiments, the determination of block 1106 may be as simple as a comparison of the measured current to a threshold, above which it is determined that a light is present at the photodetector and below which it is determined that no light is present. In other embodiments, the amplitude of the measured current may be translated to an amplitude of light according to an appropriate calibration of the device.

Calibration of the photodetector can be performed by using an integrated photodetector of a Fourier-transform infrared spectrometer, using the spectrally resolved output calibrated for the known output of the integrated detector. In another embodiment, a narrowband optical source can be used having a known intensity and a scannable wavelength. This optical source can be directed to the detector, and the output of the detector can be calibrated to the known intensity of the source.

Figure 13:
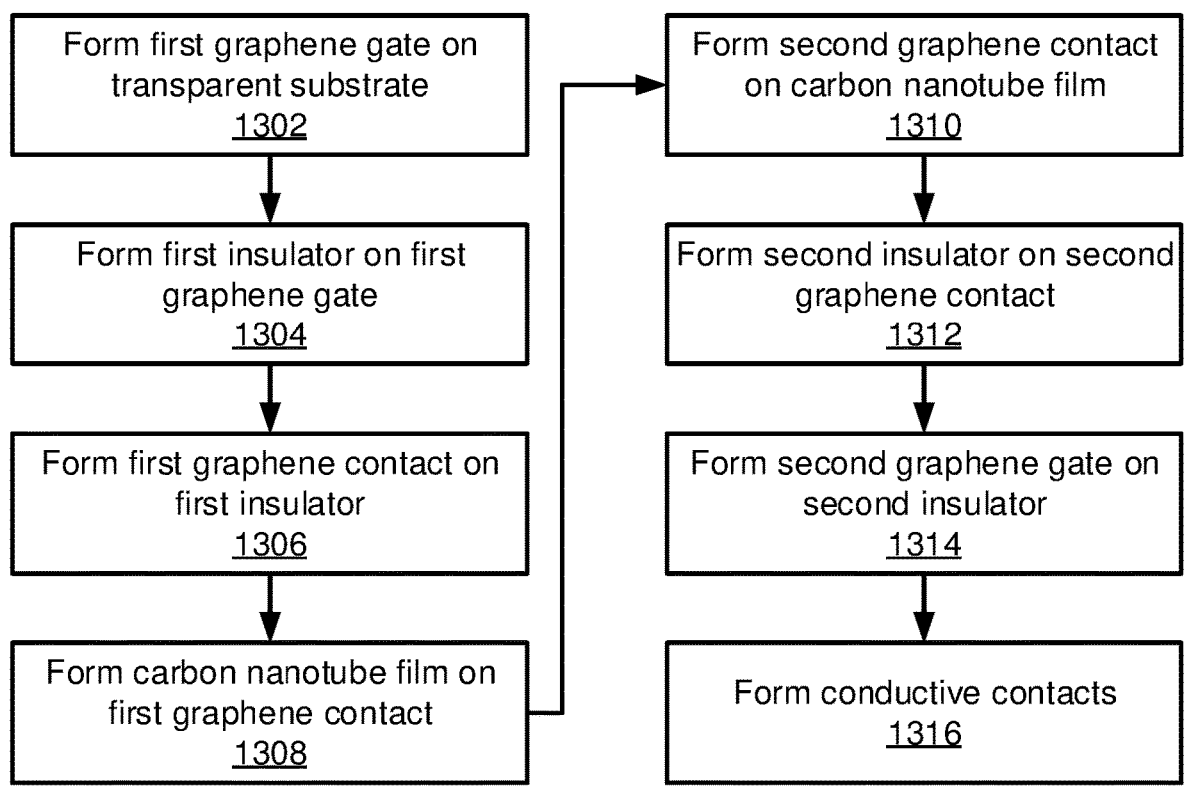
FIG. 13 is a block/flow diagram of a method of forming a carbon nanotube photodetector that is sensitive to light from two different directions in accordance with an embodiment of the present invention.

Referring now to FIG. 13, a process for forming a photodetector device is shown. Block 1302 forms the first graphene gate 1204 on a transparent substrate 1202. The graphene gate 1204 may be formed as a graphene film on a membrane and then transferred to the substrate 1202, at which point the membrane is removed. Block 1304 forms a first insulator layer 1206 on the first graphene gate 1204 from any appropriate insulator material such as, e.g., silicon dioxide. Block 1306 then forms the first graphene contact 1208 on the first insulator layer 1206. The first graphene contact 1208 may be formed by the process described above for graphene films or by any other appropriate process.

Block 1308 forms the nanotube film 502 by, e.g., the process described above or by any other appropriate process and transfers the nanotube film 502 to the first graphene contact 1208. Block 1310 forms a second graphene contact 1210 on the carbon nanotube film 502, block 1312 forms second insulator 1212 on the second graphene contact 1210, and block 1314 forms second graphene gate 1214 on the second insulator 1212. Block 1316 forms appropriate conductive contacts to the first graphene gate 1204, the first graphene contact 1208, the second graphene contact 1210, and the second graphene gate 1214 as appropriate. Although in one embodiment these conductive contacts may be formed after the above-discussed layers are formed, in alternative embodiments the conductive contacts may be formed at any appropriate step of the process.

Having described preferred embodiments of graphene-contacted nanotube photodetectors (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A photodetector, comprising:
    a first electrode;
    a carbon nanotube film formed on the first electrode, comprising a plurality of carbon nanotubes that are aligned in parallel and having a same length;
    a first graphene sheet formed on the carbon nanotube film;
    a second graphene sheet configured to exert an electrical field on the first graphene sheet that changes an electrical property of the first graphene sheet.

2. The photodetector of claim 1, further comprising an insulator layer directly between the first graphene sheet and the second graphene sheet.

3. The photodetector of claim 2, further comprising a conductive metal electrode formed on a same side of the first graphene sheet as the insulator layer.

4. The photodetector of claim 1, wherein the second graphene sheet is positioned between the first graphene sheet and a light source.

5. The photodetector of claim 1, wherein the first electrode is a third graphene sheet.

6. The photodetector of claim 5, further comprising a fourth graphene sheet between the third graphene sheet and the carbon nanotube film, wherein the third graphene sheet is configured to exert an electrical field on the fourth graphene sheet that changes an electrical property of the fourth graphene sheet.

7. The photodetector of claim 6, wherein the third graphene sheet is on a substrate that is transparent to a wavelength that the carbon nanotube film is responsive to.

8. The photodetector of claim 7, wherein the substrate is formed from a material selected from the group consisting of glass, zinc selenide, and high-resistivity silicon.

9. A photodetector, comprising:
    a first electrode, formed from a first graphene sheet;
    a carbon nanotube film formed on the first electrode;
    a second graphene sheet formed on the carbon nanotube film;
    a third graphene sheet configured to exert an electrical field on the second graphene sheet that changes an electrical property of the second graphene sheet; and
    a fourth graphene sheet between the first graphene sheet and the carbon nanotube film, wherein the first graphene sheet is configured to exert an electrical field on the fourth graphene sheet that changes an electrical property of the fourth graphene sheet.

10. The photodetector of claim 9, further comprising an insulator layer directly between the second graphene sheet and the third graphene sheet.

11. The photodetector of claim 10, further comprising a conductive metal electrode formed on a same side of the second graphene sheet as the insulator layer.

12. The photodetector of claim 9, wherein the third graphene sheet is positioned between the second graphene sheet and a light source.

13. The photodetector of claim 9, wherein the carbon nanotube film comprises a plurality of carbon nanotubes that are aligned in parallel and having a same length.

14. The photodetector of claim 9, wherein the first graphene sheet is on a substrate that is transparent to a wavelength that the carbon nanotube film is responsive to.

15. The photodetector of claim 14, wherein the substrate is formed from a material selected from the group consisting of glass, zinc selenide, and high-resistivity silicon.

* * * * *